(12) United States Patent
Okuda et al.

(10) Patent No.: US 8,406,379 B2
(45) Date of Patent: Mar. 26, 2013

(54) CURVATURE DISTRIBUTION CRYSTAL LENS AND X-RAY REFLECTOMETER

(75) Inventors: Hiroshi Okuda, Kyoto (JP); Kazuo Nakajima, Sendai (JP); Kozo Fujiwara, Sendai (JP)

(73) Assignees: Kyoto University, Kyoto (JP); Tohoku University, Miyagi-Ken (JP)

( * ) Notice: Subject to any disclaimer, the term of this patent is extended or adjusted under 35 U.S.C. 154(b) by 456 days.

(21) Appl. No.: 12/733,361

(22) PCT Filed: Aug. 28, 2008

(86) PCT No.: PCT/JP2008/065420
§ 371 (c)(1),
(2), (4) Date: Feb. 25, 2010

(87) PCT Pub. No.: WO2009/028613
PCT Pub. Date: Mar. 5, 2009

(65) Prior Publication Data
US 2010/0208868 A1    Aug. 19, 2010

(30) Foreign Application Priority Data

Aug. 31, 2007    (JP) ................................ 2007-227174

(51) Int. Cl.
*G21K 1/06* (2006.01)
*G01N 23/20* (2006.01)

(52) U.S. Cl. ........................... 378/147; 378/71; 378/84

(58) Field of Classification Search .............. 378/70–77, 378/82–90, 145, 147, 156, 159, 204, 210; 356/239.2
See application file for complete search history.

(56) References Cited

FOREIGN PATENT DOCUMENTS

| JP | 62-231198 | 10/1987 |
|---|---|---|
| JP | 2002-286658 | 10/2002 |
| JP | 2004-061129 | 2/2004 |
| JP | 2005-142370 | 6/2005 |
| WO | WO 2006/022333 | 3/2006 |
| WO | WO 2007/072906 | 6/2007 |

OTHER PUBLICATIONS

Markert, et al. (1995) "Evaluation of curved crystals for cosmic x-ray spectroscopy" Optical Engineering, vol. 34, No. 5, p. 1512-1523.

(Continued)

*Primary Examiner* — Anastasia Midkiff
(74) *Attorney, Agent, or Firm* — Harness, Dickey & Pierce, P.L.C.

(57) ABSTRACT

In one embodiment of the present invention, a curvature distribution crystal lens of the present invention is obtained via press-molding. In the case of a Ge single crystal plate, a temperature for the press-molding is in a range 1° C. to 120° C. lower than a melting point. In the case of a Si single crystal plate, a temperature for the press-molding is in a range 1° C. to 200° C. lower than a melting point. The curvature distribution crystal lens has a crystal lattice plane forming a 1D cylindrically curved surface or a 1D logarithmically curved surface whose valley is in a direction perpendicular to a direction having a maximum curvature, the direction having the maximum curvature being within 30° from a [001] or [1-10] direction in a (110) plane. As a result, it is possible to make an integrated reflection intensity uniform and to make a half-value width uniform in a wide range. Consequently, it is possible to achieve a curvature distribution crystal lens having a wide incident angle range and a high light focusing accuracy.

12 Claims, 7 Drawing Sheets

OTHER PUBLICATIONS

Mikula, et al. (2004) "Bragg diffraction optics in neutron diffractometry" Nuclear Instruments and Methods in Physics Research Section A 529:138-147.

EP Search Report for Application No. 08828593.7 dated Dec. 5, 2011.

"X-Ray Reflectometer for the Diagnostics of Thin Films During Growth", U. Niggemeier et al., Journal of Applied Crystallography, vol. 30, 1997, pp. 905-908.

Japanese Office Action for Patent Application No. 2009-530180 mailed Dec. 6, 2011 and English Translation thereof.

CURVATURE DISTRIBUTION CRYSTAL LENS AND X-RAY REFLECTOMETER

TECHNICAL FIELD

The present invention relates to a curvature distribution crystal lens obtained by plastic deformation and to an X-ray reflectometer. Application fields of the present invention include for example curvature distribution crystal lenses used for X-ray diffraction and the like. One typical example of such curvature distribution crystal lenses is a Johann-type or Johansson-type crystal lens.

BACKGROUND ART

In a conventional X-ray monochromator, a crystal is elastically and slightly bent; then, a polishing finish is performed in order to uniformly obtain a predetermined diffraction through polishing. Alternatively, in a reversed order, the crystal is polished first and then subjected to bending deformation. A Johann-type or Johansson-type monochromator crystal, which is deformed within an elastic limit, has been in practical use.

However, with such conventional manufacturing methods of X-ray monochromator crystals, which are deformed within the elastic limit, a bend having a high curvature could not be applied. Accordingly, the conventional manufacturing methods could only be used for large-sized X-ray devices. Further, in cases where a considerable decrease in angle resolution and in integrated reflecting power is permitted, plastically deformed crystals having a low yield stress are in some cases used.

An X-ray Johann-type or Johansson-type monochromator is usually manufactured using either a method in which, subsequent to a cutting/polishing process, the crystal is additionally subjected to an appropriate elastic deformation and kept deformed, or a method in which a crystal that can be easily processed is plastically deformed.

In such methods, for example, a crystal that can be easily processed, such as a LiF crystal, is cut after having been subjected to slow elastic deformation; alternatively, such a crystal is elastically deformed by forcible attachment to a mold. Further, as disclosed in Patent Literature 1, inventors of the present application achieve an invention relating to a technology to manufacture a curvature distribution crystal lens. This technology uses as a basis a Si (100) single crystal having mostly a covalent bond, and the curvature distribution crystal lens is obtained through press molding for plastic deformation at a high temperature and under a high pressure.

However, the technique using elastic deformation has problems with regard to stability of a deformed amount in retention of the elastically deformed crystal and with regard to aging; further, because the deformation is kept within an elastic limit, an anticipated angle is limited to an extremely small value. Further, in the case of a technique using plastic deformation, as the crystallinity deteriorates due to the plastic deformation, a half-value width significantly increases and in addition, the integrated reflecting power decreases.

Further, it has become apparent that, even though it is possible to obtain a uniformly curved single crystal as a result of the plastic deformation using as a basis a Si (100) surface (as described in Patent Literature 1), an area uniformly deformed as described above becomes rather small and an incident angle range of an X-ray crystal spectrum becomes small. As a result, there is a demand for a curvature distribution crystal lens having a wide incident angle range and a high light focusing accuracy.

Citation List
Patent Literature 1
International Publication No. WO 2007/072906 (Publication Date: Jun. 28, 2007)

SUMMARY OF INVENTION

The present invention is attained in view of the above-described problems. An object of the invention is to achieve a curvature distribution crystal lens having a wide incident angle range and a high light focusing accuracy.

In order to solve the above-described problems, a curvature distribution crystal lens according to the present invention is obtained by plastic deformation of a Ge (110) single crystal plate, the plastic deformation being carried out by high-temperature press-molding, the curvature distribution crystal lens having a crystal lattice plane forming a 1D cylindrically curved surface or a 1D logarithmically curved surface whose valley is in a direction perpendicular to a direction having a maximum curvature, the direction having the maximum curvature being within 30° from a [001] or [1-10] direction in a (110) plane.

Further, in order to solve the above-described problems, a curvature distribution crystal lens according to the present invention is obtained by plastic deformation of a Si (110) single crystal plate, the plastic deformation being carried out by high-temperature press-molding, the curvature distribution crystal lens having the crystal lattice plane forming a 1D cylindrically curved surface or a 1D logarithmically curved surface whose valley is a direction perpendicular to a direction having a maximum curvature, the direction having the maximum curvature being within 30° from a [001] or [1-10] direction in a (110) plane.

In the present Specification, it must be noted that the "(110) single crystal plate" includes single crystal plates each having a plane direction inclined, with respect to an ideal plane direction (110), within a range of variations (specifically, from 0 to 2°) that occur due to a manufacturing process.

According to the present invention, the high-temperature press-molding is preferably performed at a temperature just below a melting point. Specifically, in the case of Si, such a temperature is preferably in a range 1° C. to 200° C. lower than the melting point, and more preferably in a range 1° C. to 120° C. lower than the melting point; in the case of Ge, such a temperature is preferably in a range 1° C. and 120° C. lower than the melting point, and more preferably in a range 1° C. to 60° C. lower than the melting point. This makes it possible to perform plastic forming.

Further, in a case where the Si or Ge (110) single crystal has been plastically deformed into a hemispherical shape, it is possible to obtain a uniform deformation area that is relatively large in one direction ([1-10] direction) and that has 2-fold rotational symmetry. Further, even though the deformation area with respect to a curvature is smaller in a [001] direction compared to that in the [1-10] direction, it is possible to reduce a torsion in cylindrical deformation because a deformation pattern similarly has 2-fold symmetry.

Accordingly, by arranging the crystal lattice plane to form a 1D cylindrically curved surface or a 1D logarithmically curved surface whose valley is in a direction perpendicular to a direction having a maximum curvature that is within 30° from a [001] or [1-10] direction in a (110) plane, it becomes possible to obtain a large uniform deformation area even in the maximum curvature direction. Consequently, it is possible to provide a wider incident angle range of the X-ray crystal spectrum.

Further, with the above configuration, because the uniform deformation area becomes larger, it is possible to arrange a curvature error (σ) of the crystal lattice plane to a value equal to or below 0.1° in the incident angle (anticipated angle) range of 30°. As a result, in a wide range, uniformity of an integrated reflection intensity and of the half-value width becomes preferable. In other words, it is possible to achieve a curvature distribution crystal lens having a high light focusing accuracy.

In addition, in the curvature distribution crystal lens according to the present invention, a crystal surface may be polished so that an inclination of the crystal lattice plane with respect to the crystal surface meets Johansson's diffraction condition.

In this way, it is possible to meet Johansson's diffraction condition and to improve efficiency of the light focusing.

Further, an X-ray reflectometer of the present invention includes an X-ray generating source, the curvature distribution crystal lens as described above and a position-sensitive detector.

With the above configuration, it is possible to irradiate a sample with X-rays that are generated from the X-ray generating source and that are diffracted by the curvature distribution crystal lens. Then, it is possible to detect, using the position-sensitive detector, an intensity of X-rays reflected by the sample.

In the present invention, the position-sensitive detector includes for example a PSPC, a photostimulable film such as an IP (Imaging Plate), a CCD (Charge Coupled Device), a PD (PhotoDiode) array and the like.

In the present invention, as described above, the curvature distribution crystal lens has a wide incident angle range and a high light focusing accuracy. As a result, light focusing of X-rays in a wide angle becomes possible. This makes it possible to significantly increase an X-ray intensity.

REFERENCE SIGNS LIST 7 position-sensitive detector
10 curvature distribution crystal lens
11 X-ray reflectometer
12 X-ray generating source

DESCRIPTION OF EMBODIMENTS

A curvature distribution crystal lens of the present invention is a focusing crystal used in an X-ray diffraction device and the like, and has a high precision and a wide incident angle range of an X-ray crystal spectrum.

Through experimentation, the inventors of the present invention have acquired the knowledge that it is possible to manufacture, through the following method, a curvature distribution crystal lens having a crystal lattice plane whose curvature distribution meets linear convergence conditions. In that method, a load is applied, at a temperature less than a fusing point of the crystal, entirely or locally to a crystal plate having a high yield stress, such as an Si or Ge crystal plate, and the crystal plate is plastically deformed (see Patent Literature 1).

However, as described above, it has become apparent that, when the Si (100) single crystal described in Patent Literature 1 is used, an incident angle range of an X-ray crystal spectrum becomes rather small. Accordingly, the inventors of the present invention studied diligently (i) factors making the incident angle range small and (ii) factors allowing for good light focusing, and arrived at the invention of the present application.

Figure 2:
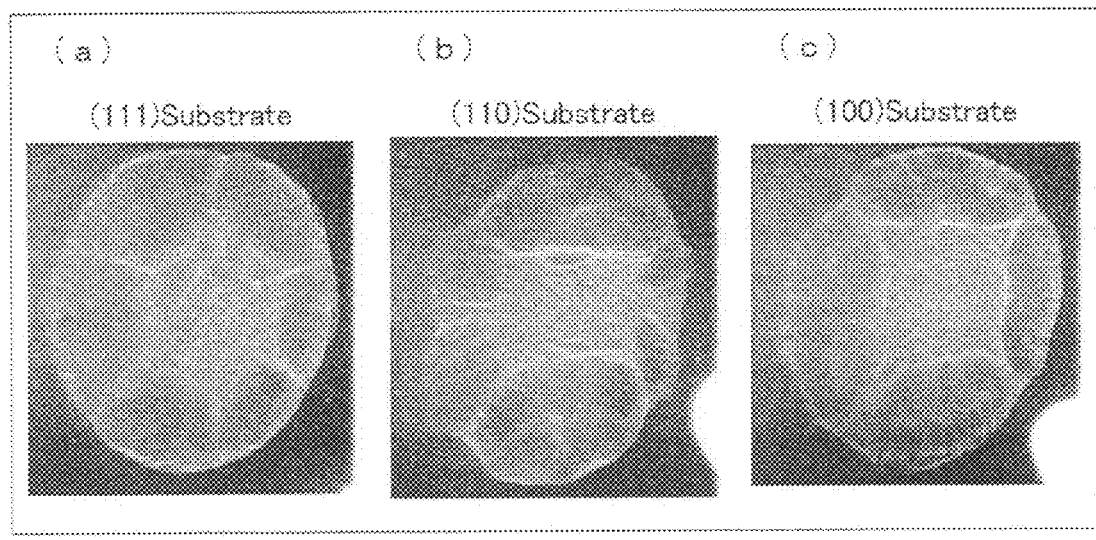
FIG. 2 illustrates three images of reflected light from an Si plate which has been plastically deformed so as to become spherical. (a) of FIG. 2 illustrates the case of a (111) single crystal, (b) of FIG. 2 illustrates the case of a (110) single crystal, and (c) of FIG. 2 illustrates the case of a (100) single crystal.

First, the inventors sandwiched a 0.5 mm-thick Si substrate between (i) a mold having a hemispherical convex section that had a 50 mm curvature radius and (ii) another mold having a hemispherical concave section that had substantially the same curvature radius; then, plastic deformation was performed at a temperature of 1,300° C. and under a pressurizing force of 20 kgf. Three single crystal types of single crystals, namely, a (111) single crystal, a (110) single crystal and a (100) single crystal, were used for the Si substrate. Further, images of reflected light from a wafer deformed so as to become spherical were observed. FIG. 2 illustrates three images of reflected light from the Si substrates which had been plastically deformed so as to become spherical. (a) of FIG. 2 illustrates the case of the (111) single crystal; (b) of FIG. 2 illustrates the case of the (110) single crystal; and (c) of FIG. 2 illustrates the case of the (100) single crystal.

Because, as may be shown in FIG. 2, image undulations and slip lines are visible at respective peripheries of the images, it is clear that the Si substrate is deformed ununiformly. In the vicinity of a center of each image, it is recognized that an area deformed uniformly (i.e. uniform deformation area) is present. However, it has become apparent that: in the case of the (100) single crystal, the image has 4-fold rotational symmetry and the uniform deformation area is rather small; in the case of the (110) single crystal, the image has 2-fold rotational symmetry and a large uniform deformation area can be obtained in an [1-10] direction; and in the case of the (111) single crystal, the image has 6-fold rotational symmetry, and a relatively large uniform deformation area can be obtained. Similar symmetrical features can be observed when Ge is used.

The inventors of the present invention found it appropriate to use the uniform deformation area of the (110) single crystal in a case where deformation to produce 2-fold rotational symmetry, e.g., cylindrical bending is carried out.

Figure 3:
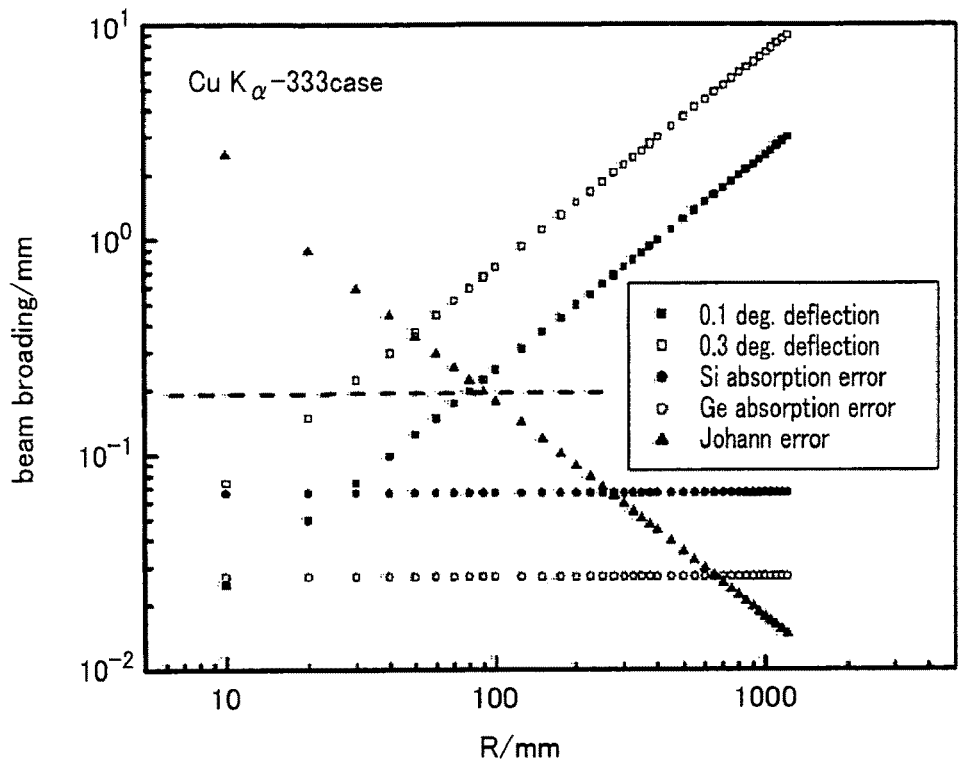
FIG. 3 illustrates various factors causing broadening of focal points of Si or Ge diffraction lines with respect to Cu.
Figure 4:
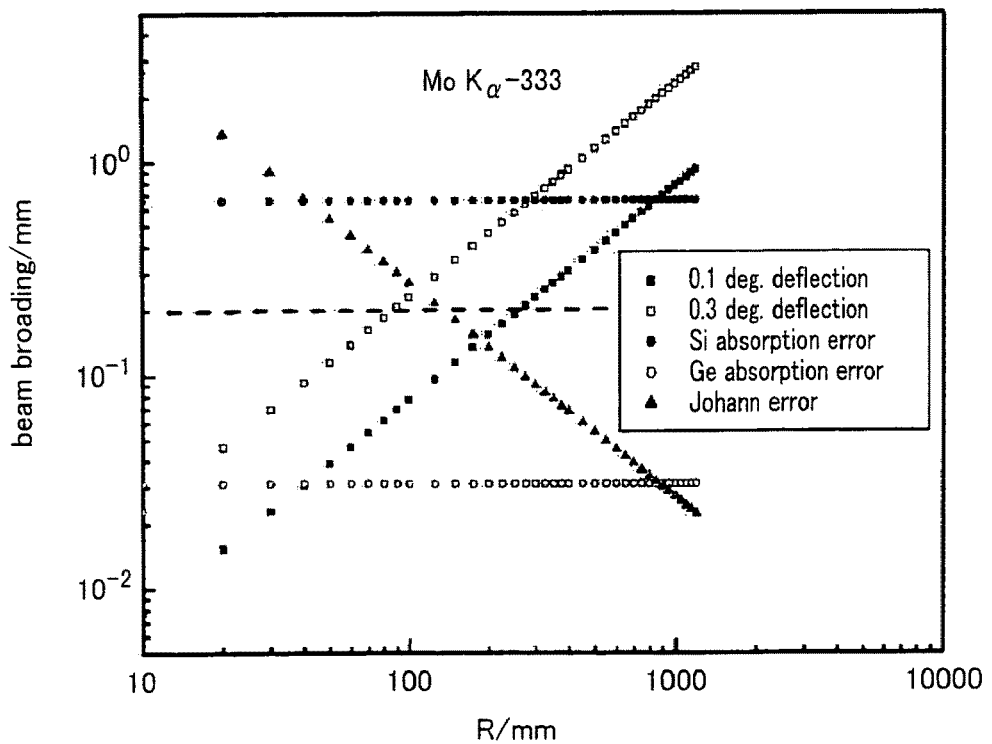
FIG. 4 illustrates various factors causing broadening of focal points of Si or Ge diffraction lines with respect to Mo.

Further, FIG. 3 is a diagram showing a result of computation of factors of broadening of focal points of Si and Ge diffraction lines with respect to a Cu Kα characteristic X-ray. FIG. 4 is a diagram showing a result of computation of factors of broadening of focal points of Si and Ge diffraction lines with respect to a Mo Kα characteristic X-ray. In FIGS. 3 and 4, the "0.1 deg. deflection" plotted and the "0.3 deg. deflection" plotted have an angle error of 0.1° and 0.3°, respectively, in a crystal plane. These "0.1 deg. deflection" plotted and the "0.3 deg. deflection" plotted illustrate broadening of the diffraction lines at respective focal point positions, in a case where diffraction occurs while the above variations still exist. The "absorption error" plotted illustrates a scale of a focal point blur caused by an imprecise positioning due to absorption into a sample. The "Johann error" plotted illustrates broadening of a focal point caused by a shift from Johansson's condition in a case where diffraction under Johann's condition occurs. Because diffraction having the broadening over a diffraction half-value width does not occur in reality, the broadening at a lower R is limited to a diffraction half-value width of the crystal. The data illustrated in FIGS. 3 and 4 allowed the inventors to find that a key element for obtaining good light focusing in a crystal having a high R is to suppress a lattice plane curvature error.

The present invention is based on the above findings.

The following is an explanation of a curvature distribution crystal lens and of an X-ray reflectometer, in accordance with an embodiment of the present invention.

1. Regarding Curvature Distribution Crystal Lens

A curvature distribution crystal lens of the present embodiment uses, as a basis, a Si or Ge (110) single crystal. Note that a (110) single crystal plate may have a plane direction inclined within a range of variations due to a manufacturing process with respect to an ideal plane direction (110). Specifically, such a range is from 0° to 2°. The curvature distribution crystal lens is obtained by subjecting the (110) single crystal plate to press-molding at a temperature just below a melting point so that the crystal lattice plane forms a 1D cylindrically curved surface or a 1D logarithmically curved surface whose valley is in a direction perpendicular to a direction having a maximum curvature. Such a direction having the maximum curvature is within 30° from a [001] direction or a [1-10] direction in a (110) plane.

The (110) single crystal exhibits 2-fold rotational symmetry and the widest uniform deformation area is obtained in the [1-10] direction, as shown on (b) of FIG. 2. Further, regarding the (110) single crystal, even in a direction within 30° from the [1-10] direction in the (110) plane, it is possible to obtain a wide uniform deformation area. Accordingly, regarding the (110) single crystal, by arranging the maximum curvature direction to be within 30° from the [1-10] direction in the (110) plane, it is possible (i) to obtain a wide uniform deformation area even in the maximum curvature direction and also (ii) to provide a wider incident angle range of the X-ray crystal spectrum. Further, even though the deformation area with respect to the curvature is smaller in the [001] direction than that in the [1-10] direction, it is possible to reduce a torsion due to the cylindrical deformation. This is because deformed patterns in the respective cases of the [001] direction and the [1-10] direction similarly exhibit 2-fold symmetry. In addition, because the curvature distribution crystal lens has a 1D cylindrically curved surface or a 1D logarithmically curved surface, ray convergence conditions are met.

In the present Specification, the wording "temperature just below the melting point" refers to a heating temperature in a range from a temperature whereat a plastic deformation process by plastic deformation of the single crystal plate is possible to a temperature lower than a temperature whereat a partial meltdown starts at the time when a pressure is applied. The temperature just below the melting point in the case of Ge is 1° C. to 120° C. below the melting point (more preferably 1° C. to 60° C. below the melting point). The temperature just below the melting point in the case of Si is 1° C. to 200° C. below the melting point (more preferably 1° C. to 120° C. below the melting point).

The curvature distribution crystal lens of the present embodiment has a Johann-type or Johansson-type monochromator shape.

The curvature distribution crystal lens used in the case of a Johann-type lens has a crystal lattice plane forming either a 1D cylindrically curved surface or a 1D logarithmically curved surface. The curvature distribution crystal lens having a 1D logarithmically curved surface allows for a more accurate light focusing than the curvature distribution crystal lens having a 1D cylindrically curved surface.

Further, the curvature distribution crystal lens that may be used in the case of a Johansson-type lens has a crystal lattice plane forming a 1D cylindrical curved surface.

2. Configurations of Curvature Distribution Crystal Lens and X-Ray Reflectometer Next is an explanation regarding configurations of the curvature distribution crystal lens and of the X-ray reflectometer.

Figure 5:
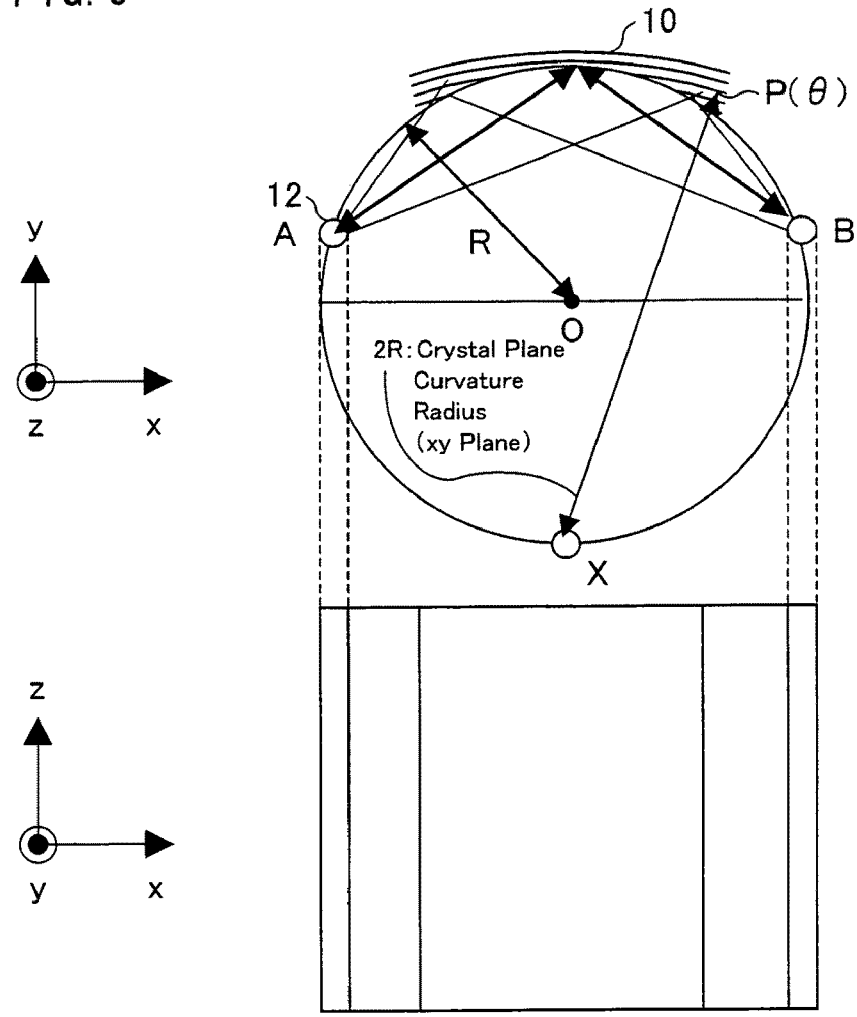
FIG. 5 illustrates a positional relationship of the curvature distribution crystal lens, the X-ray generating source, and the light focusing position.

FIG. 5 illustrates a configuration in which a curvature distribution crystal lens 10 is disposed so that an X-ray generating source 12 and a light focusing position B are symmetrical with respect to the curvature distribution crystal lens 10. The curvature distribution crystal lens 10, a position A of the X-ray generating source 12, and the light focusing position B are disposed so as to be located on one circle (Rowland circle; radius R). It must be noted that the curvature distribution crystal lens 10 illustrated in FIG. 5 is a Johansson-type lens.

Figure 6:
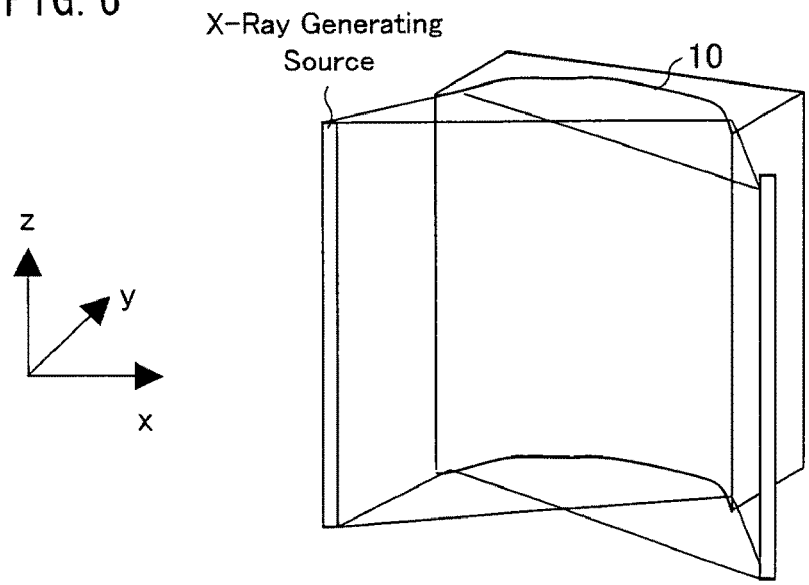
FIG. 6 is a perspective view of the curvature distribution crystal lens illustrated in FIG. 5.

Further, FIG. 6 is a perspective view of the curvature distribution crystal lens 10 illustrated in FIG. 5. As shown in FIG. 6, a cross section always has an identical shape of one Johansson-type monochromator on an assumption that the cross section is obtained by cutting the curvature distribution crystal lens 10 along a plane perpendicular to an axis along which the linear X-ray generating source 12 extends.

With the curvature distribution crystal lens 10 as described above, it becomes possible to strictly meet Johansson's crystal diffraction condition in a wide angle range, and this allows for light focusing of a wide angle range.

While the above explanations regarding FIGS. 5 and 6 are on Johansson-type monochromators, it must be noted that, as described above, Johann-type monochromators may also be used.

Figure 7:
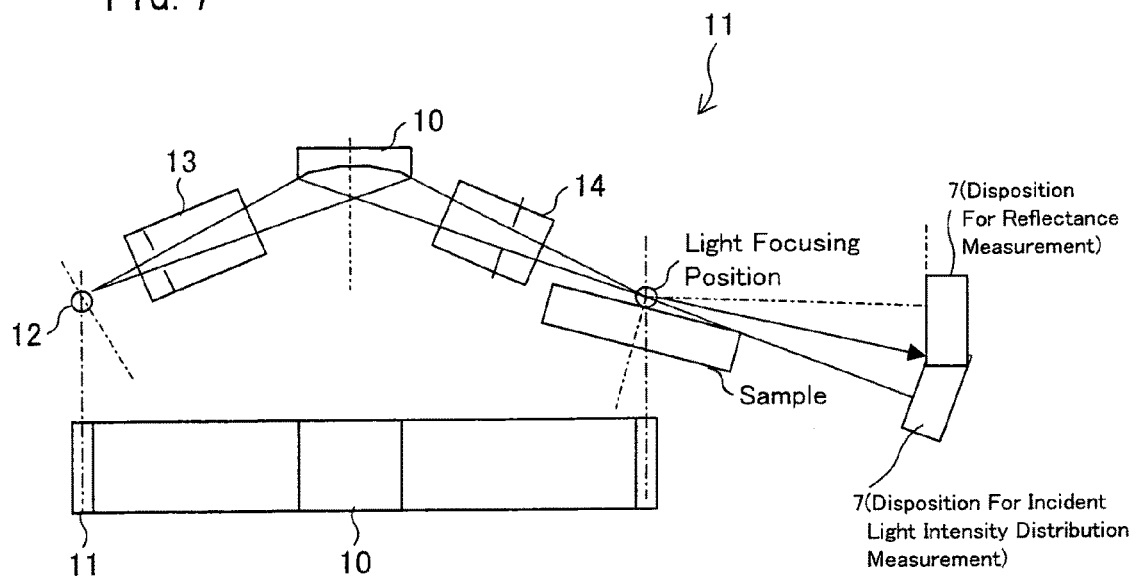
FIG. 7 illustrates a configuration of an X-ray reflectometer using the curvature distribution crystal lens.

FIG. 7 illustrates a configuration of an X-ray reflectometer 11 using the curvature distribution crystal lens 10 described above. As shown in FIG. 7, the X-ray reflectometer 11 includes the curvature distribution crystal lens 10, the linear X-ray generating source 12, a capture slit 13, a forming slit 14, and a position-sensitive detector 7.

In the configuration of the X-ray reflectometer 11 illustrated in FIG. 7, X-rays provided from the X-ray generating source 12 are cut through the capturing slit so as to leave only x-rays in necessary capture angles, and are guided to the curvature distribution crystal lens 10. Then, among the X-rays diffracted by the curvature distribution crystal lens 10, diffracted X-rays having a degraded quality in a circumferential section of the crystal lens are shielded/formed by the forming slit 14. Subsequently, resultant X-rays enter a light focusing position on the sample. Then, X-rays reflected by a sample enter the position-sensitive detector 7.

The position-sensitive detector 7 provided in the X-ray reflectometer 11 can move between a disposition for reflectance measurement and a disposition for incident light intensity distribution measurement. The disposition for the reflectance measurement and the disposition for incident light intensity distribution measurement may be relocated as appropriate depending on whether to perform a reflectance measurement or to find an X-ray intensity distribution.

With this configuration of the X-ray reflectometer 11, the X-rays generated from the linear X-ray generating source 12 are focused into a line on the sample by the curvature distribution crystal lens 10. Focusing the X-rays in a line as above makes it possible to scan quickly a wide area on the sample. Accordingly, the X-ray reflectometer 11 may be suitable for irradiation of X-rays on a large sample.

Regarding the curvature distribution crystal lens 10 of the present embodiment, the maximum curvature direction (x direction in FIG. 5) is a direction within 30° from the [001] direction or the [1-10] direction in the (110) plane, and this maximum curvature direction allows for obtaining a larger uniform deformation area even after deformation. Accordingly, it becomes possible to increase the incident angle range (range of capture angles) of the X-rays. This can further improve light focusing efficiency.

As a result, it is possible to significantly increase a light intensity of the X-ray reflectometer (i.e. an X-ray diffracting device such as a powder diffractometer, a diffuse scattering measuring device, a small angle scattering device and the like). Further, it becomes possible to achieve a wide-aperture optical system constituting an X-ray reduction/magnification optical system. This makes it possible to obtain an X-ray microscope, a reduced exposure and the like.

3. Manufacturing Method of Curvature Distribution Crystal Lens

The following is an explanation of a manufacturing method of the curvature distribution crystal lens of the present embodiment. The curvature distribution crystal lens of the present embodiment is manufactured by: (i) sandwiching an Si or Ge (110) single crystal plate between a pair of molds each having a 1D cylindrically curved surface or a 1D logarithmically curved surface, and (ii) performing a press-molding process at a high temperature under a high pressure. With this manufacturing process, it is possible to obtain a Johann-type curvature distribution crystal lens.

It must be noted that the press-molding process is performed so that (i) a direction having maximum curvature is within 30° from a [001] direction or of a [1-10] direction in a (110) plane and (ii) a direction perpendicular to the direction having the maximum curvature becomes a valley (axial direction).

In this case, the wording "a 1D cylindrically curved surface or a 1D logarithmically curved surface" refer to a curved surface for which, at each point P (0) of the crystal lattice plane of the curvature distribution crystal lens, an inclination of the crystal lattice plane with respect to the crystal surface is perpendicular to a straight line connecting the point P (0) to a point X, as shown in FIG. 5.

Figure 8:
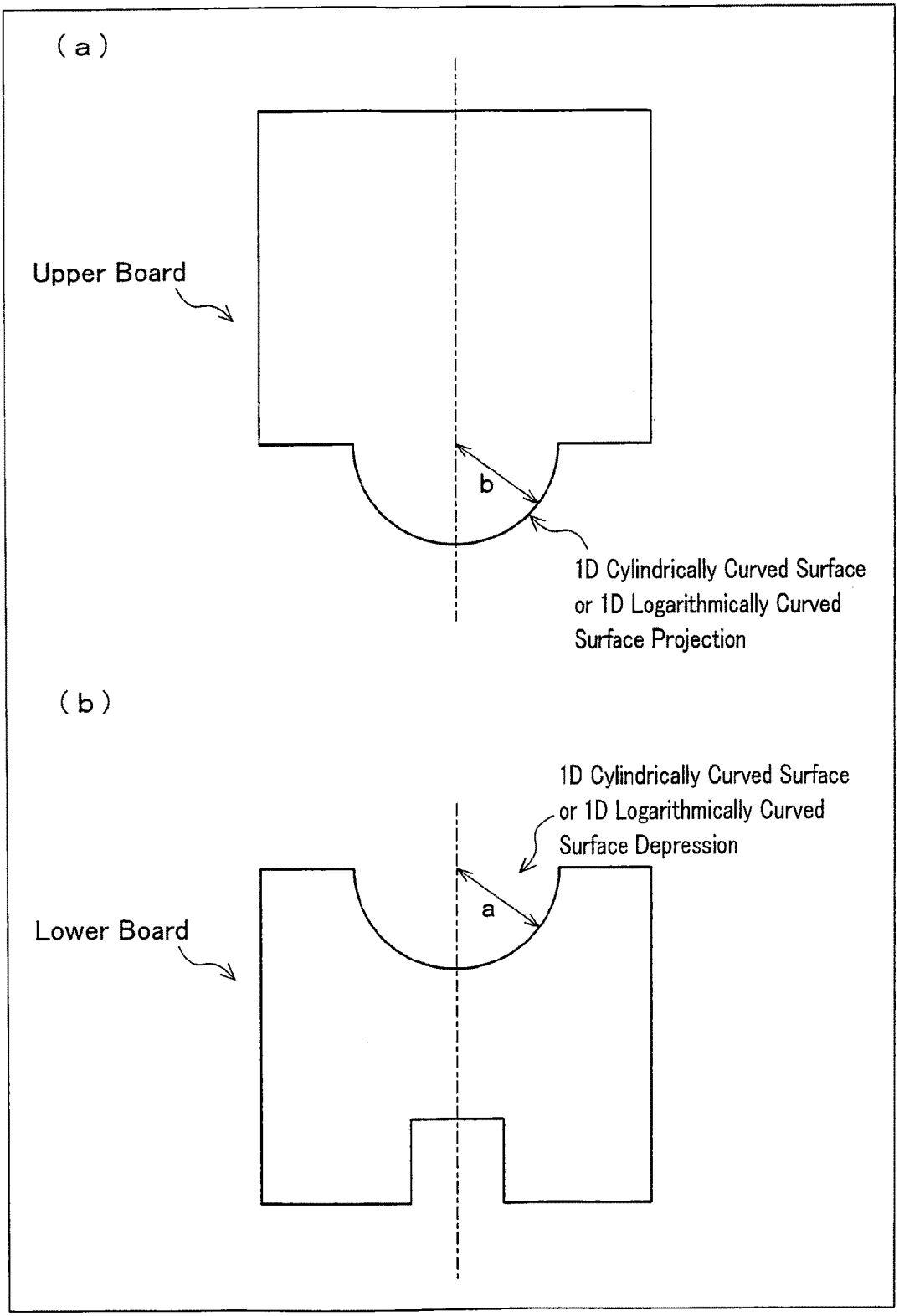
FIG. 8 illustrates a mold used in a press molding. (a) of FIG. 8 illustrates an upper board of the mold, and (b) of FIG. 8 illustrates a lower board of the mold.

The press molding of the curved surface employs an upper board (convex press-molding member) illustrated in (a) of FIG. 8 and a lower board (concave press-molding member) illustrated in (b) of FIG. 8. These upper board and lower board are made from carbon, and are used in a process for forming a Si or Ge (110) single crystal into a curved surface by (i) sandwiching the Si or Ge (110) single crystal and (ii) applying a pressure onto this Si or Ge (110) single crystal.

As shown in (a) of FIG. 8, a projection (convex section) having a 1D cylindrically curved surface or a 1D logarithmically curved surface is formed on a lower surface of the upper board (convex press-molding member). In contrast, as shown in (b) of FIG. 8, a depression (concave section) having a 1D cylindrically curved surface or a 1D logarithmically curved surface is formed on an upper surface of the lower board (concave press-molding member).

A release agent is applied on the lower surface of the upper board and the upper surface of the lower board, and then an annealing process is once performed at a high temperature. Subsequently, the Si or Ge (110) single crystal is sandwiched between the upper board and the lower board each having been subjected to the annealing process, and disposed inside a vertical furnace. It must be noted that the process of applying the releasing agent may be omitted, depending on a material used for a semiconductive single crystal plate or on molding conditions.

At this time, the Si or Ge (110) single crystal plate is disposed so that a direction perpendicular to the direction within 30° from the [001] direction or the [1-10] direction in the (110) plane is identical to the axial direction of the 1D cylindrically curved surface or the 1D logarithmically curved surface of the convex section of the upper board and of the concave section of the lower board.

In order to prevent contamination or heat-induced surface degradation, a heat-resistant surface-protecting overcoat having a low level of impurities, for example, a releasing agent, may be applied on an entire surface or on a part of a surface of the Si or Ge (110) single crystal plate. The vertical furnace is provided with a metal push bar on an upper section of the vertical furnace. The metal push bar is operated outside the vertical furnace so as to apply a load on the upper surface of the upper board, so that it becomes possible to apply force necessary to deform the Si or Ge (110) single crystal plate.

Then, temperatures of the upper board, the lower board and the single crystal plate set as above are raised, in a hydrogen atmosphere, to the temperature just below the melting point as previously described. When the temperature just below the melting point is reached, for example, a load of approximately 200 N is applied by lowering the metal push bar inside the furnace so as to press the upper surface of the upper board. As mentioned previously, the temperature just below the melting point is, in the case of Si, between 1° C. and 200° C. lower than the melting point (more preferably between 1° C. and 120° C. lower than the melting point); in the case of Ge, the temperature just below the melting point is between 1° C. and 120° C. lower than the melting point (more preferably between 1° C. and 60° C. lower than the melting point). By selecting such temperature ranges, it becomes possible to stably achieve plastic deformation which is not problematic to characteristics of the curvature distribution crystal lens.

In this way, a compressive force is applied to the Si or Ge (110) single crystal plate as well, and due to such application of pressure at a high temperature, the single crystal is plastically deformed to form a curved surface between the upper board and the lower board. Note that the load should be applied on the upper board for approximately one minute.

With this plastic deformation, the crystal lattice plane of the Si or Ge (110) single crystal plate forms the 1D cylindrically curved surface or 1D logarithmically curved surface as defined by the shape of the concave section of the lower surface of the upper board and by the shape of the convex section of the upper surface of the lower board.

In the case where the concave section and the convex section have a 1D cylindrically curved surface, a curvature radius is set to 2R, that is twice the radius of the Rowland circle. However, taking into account a thickness of the single crystal plate to be sandwiched therebetween, a curvature radius of the lower board is made slightly larger. In this way, when the curvature distribution crystal lens is disposed on the Rowland circle, it is possible to focus, substantially on the light focusing position B, the light emitted from the X-ray generating source 12.

Further, in the case where the concave section and the convex section have a 1D logarithmically curved surface and where the curvature distribution crystal lens is disposed on the Rowland circle, even a Johann-type curvature distribution crystal lens can more reliably focus, on the light focusing position B, the light emitted from the X-ray generating source 12.

As shown on (b) of FIG. 2, in the curvature distribution crystal lens obtained as above, the crystal lattice plane is bent to form the 1D logarithmically curved surface, so that the maximum curvature direction is arranged to be the direction which is within 30° from the [001] direction or the [1-10] direction in the (110) plane and in which a deformation pattern has 2-fold symmetry. This makes it possible to reduce a torsion due to the cylindrical deformation. Therefore, it is possible to obtain a uniform deformation area having a wide range.

In the case where a Johansson-type curvature distribution crystal lens is to be obtained, the crystal surface should be polished so as to form a 1D logarithmically curved surface having a curvature radius R after completion of the press-molding process as above. Alternatively, the crystal surface should be preliminarily polished so that one of crystal surfaces meets Johansson's diffraction condition (that is to say, one of the crystal surfaces becomes a crystal surface forming a 1D cylindrically curved surface having the curvature radius R of the Rowland circle) after the press-molding process.

Verification Results Regarding Accuracy of Curvature Distribution Crystal Lens

The following is an explanation on results of verification of curvature error of the crystal lattice plane, and the integrated reflection intensity and the uniformity of the half-value width (FWHM).

Figure 9:
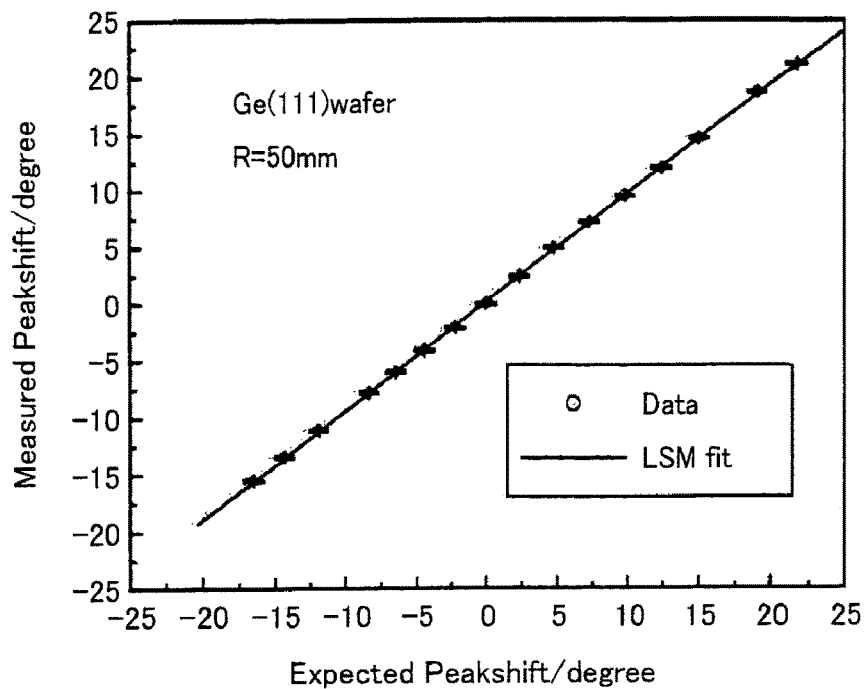
FIG. 9 illustrates a curvature of a crystal lattice plane of a curvature distribution crystal lens using a Ge (111) single crystal plate.
Figure 10:
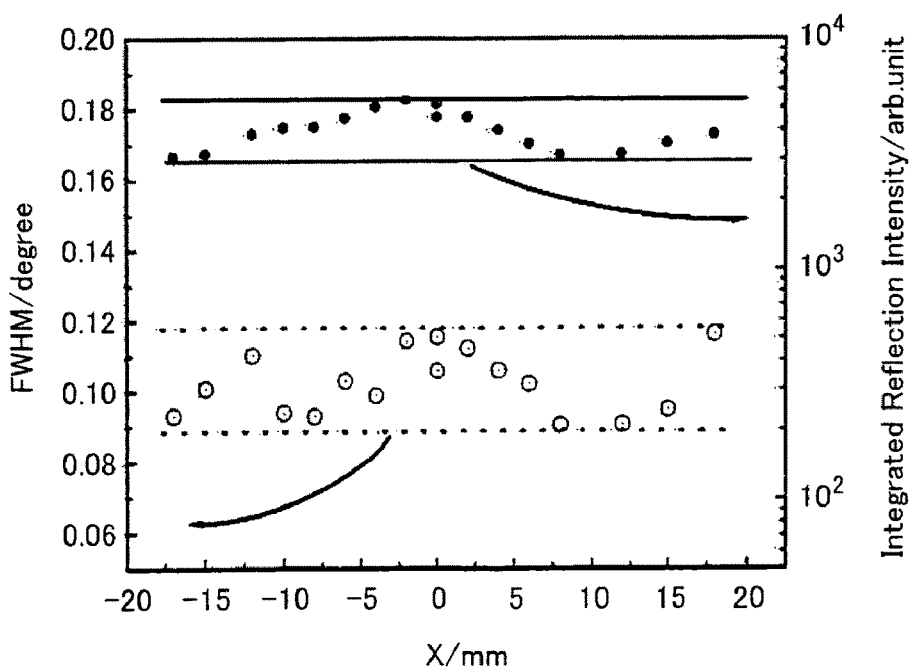
FIG. 10 illustrates a half-value width and an integrated reflection intensity of a curvature distribution crystal lens using a Ge (111) single crystal plate.

First, for comparison, a control curvature distribution crystal lens was manufactured using a Ge (111) single crystal plate. This control curvature distribution crystal lens was arranged to have a crystal lattice plane that is deformed so as to form a 1D cylindrically curved surface whose curvature radius is 2R=50 mm (similarly to the curvature distribution crystal lens of the present embodiment). The curvature error of the crystal lattice plane, and the integrated reflection intensity and the half-value width were then measured using a Cu Kα1 440 reflected light. FIG. 9 illustrates measurement results of the curvature of the crystal lattice plane. FIG. 10 illustrates measurement results of the integrated reflection intensity (right vertical axis) and of the half-value width (left vertical axis). In FIG. 9, the vertical axis indicates measured values of peak shift and the horizontal axis indicates ideal values of peak shift. The results shown in FIG. 9 allowed the inventors to find that the curvature error (σ) of the crystal lattice plane is 0.133° with regard to an anticipated angle of 35°. In FIG. 10, the horizontal axis indicates positional coordinates of the maximum curvature direction in the curvature distribution crystal lens.

Next, a curvature error of a crystal lattice plane, an integrated reflection intensity and a half-value width of a curvature distribution crystal lens were measured. This curvature distribution crystal lens was manufactured using a Ge (110) single crystal plate and had the crystal lattice plane forming a 1D cylindrically curved surface. In this cylindrically curved surface, a direction having the maximum curvature was a direction rotated by approximately 20° from the [001] direction, and the 1D cylindrically curved surface had a valley in the direction perpendicular to the direction of the maximum curvature. It must be noted that the curvature radius of the crystal lattice plane and measured light were the same as in the case where the Ge (111) single crystal plate was used.

Figure 11:
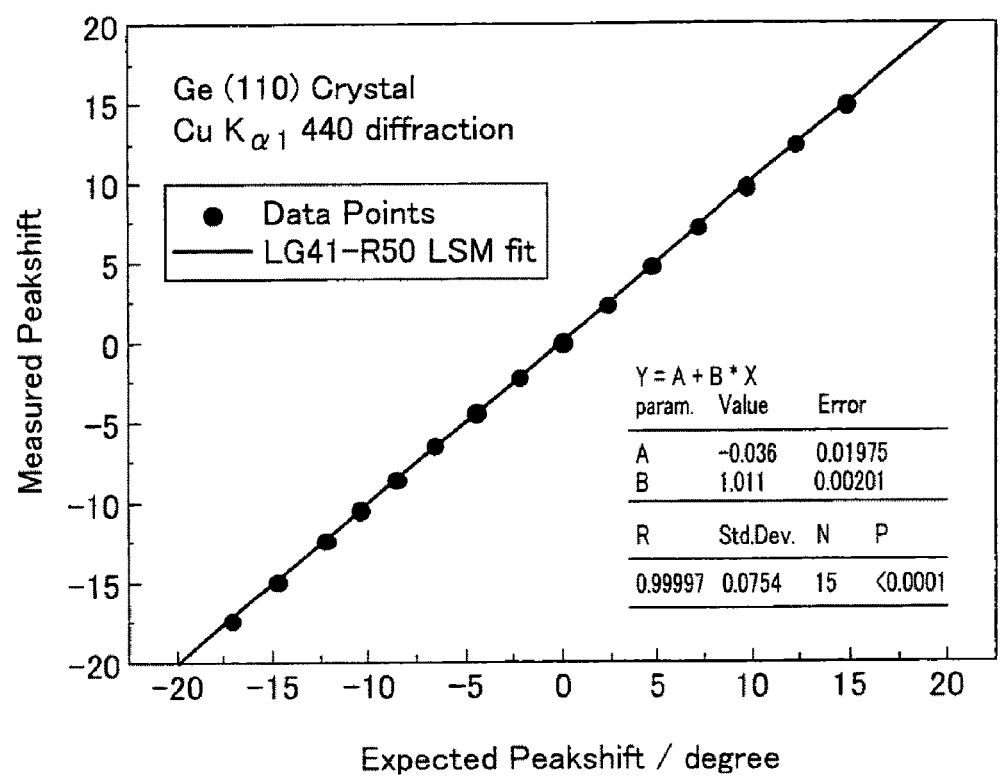
FIG. 11 illustrates a curvature of a crystal lattice plane of a curvature distribution crystal lens using a Ge (110) single crystal plate.

FIG. 11 illustrates a curvature of the crystal lattice plane of the curvature distribution crystal lens made from the Ge (110) single crystal plate. Further, FIG. 1 illustrates measurement results of the integrated reflection intensity (right vertical axis) and of the half-value width (left vertical axis) of the curvature distribution crystal lens made from the Ge (110) single crystal plate.

The results shown in FIG. 11 allowed the inventors to find that the curvature error (a) of the crystal lattice plane is 0.075° within an anticipated angle range of 30° and it is possible to achieve a value equal to or below 0.1° within this range. In addition, the inventors also found that the uniformity of the integrated reflection intensity and the uniformity of the half-value width were excellent. Especially, excellent uniformity was obtained even in an approximately 2 cm-wide range in the maximum curvature direction of the curvature distribution crystal lens.

It was because of deformed properties of the single crystal plate as illustrated on (b) of FIG. 2 that (i) it became possible to obtain a curvature error of a crystal lattice plane equal to or below 0.1° in the range of an anticipated angle of 30° and (ii) it also became possible to obtain excellent uniformity of the integrated reflection intensity and excellent uniformity of the half-value width. By arranging a direction having the maximum curvature to be in within 30° from the [001] direction or the [1-10] direction in the (110) plane and by further arranging the direction perpendicular to the direction of the maximum curvature to be a valley, it is possible to obtain a curvature error of a crystal lattice plane equal to or below 0.1° within an anticipated angle range of 30°. Further, it also becomes possible to obtain an integrated reflection intensity and a half-value width of good uniformity.

Figure 1:
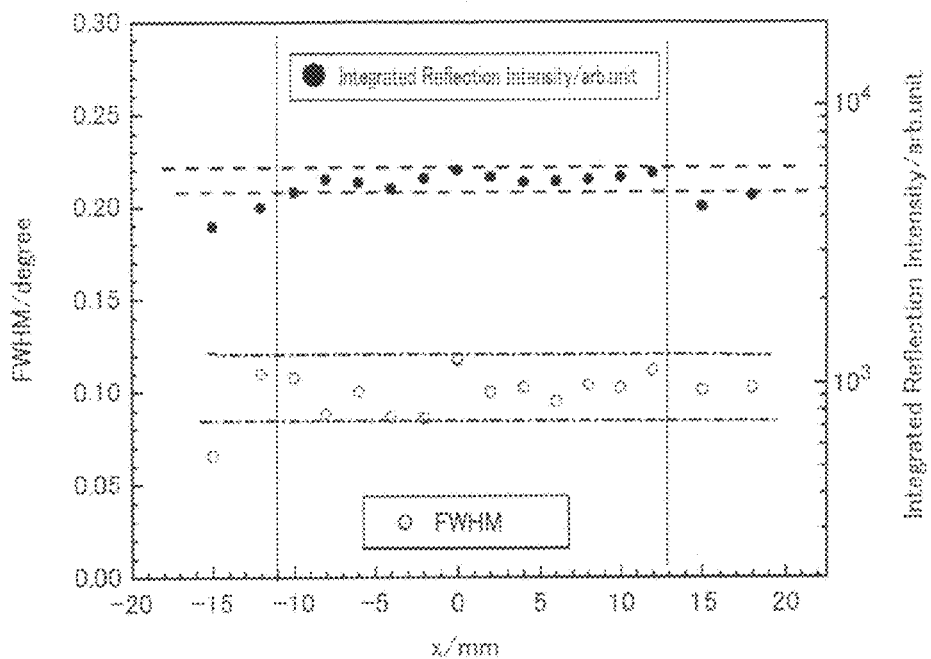
FIG. 1 illustrates a half-value width and an integrated reflection intensity of a curvature distribution crystal lens using a Ge (110) single crystal plate.

Experiment results shown in FIGS. 1 and 11 are obtained by using a Cu Kα1 440 reflected light. These experiment results are obtained under a rather strict condition such that the Cu Kα1 440 reflected light is influenced even by a slight shift. An accuracy of reflected light is further improved in the case of commonly-used Cu Kα1 220 reflected light.

FIGS. 1 and 11 show results regarding a curvature distribution crystal lens made of a Ge (110) single crystal plate; however, it is possible as well, with a curvature distribution crystal lens made of a Si (110) single crystal plate, to obtain a crystal lattice plane having a curvature error equal to or below 0.1° in an anticipated angle range of 30°, and therefore to obtain a sufficiently uniform integrated reflection intensity and a sufficiently uniform half-value width.

The present invention is not limited to the above-described embodiments, and various modifications are possible within the scope of the following claims. In other words, embodiments obtained by combining technical means as appropriate within the scope of the following claims are also included within the technical scope of the present invention.

Industrial Applicability

The curvature distribution crystal lens manufactured as described above can be applied to various X-ray devices.

The invention claimed is:

1. A curvature distribution crystal lens obtained by plastic deformation of a Ge (110) single crystal plate, the plastic deformation being carried out by high-temperature press-molding, the curvature distribution crystal lens having a crystal lattice plane forming a 1D cylindrically curved surface or a 1D logarithmically curved surface whose valley is in a direction perpendicular to a direction having a maximum curvature, the direction having the maximum curvature being within 30 ° from a [001] or [1-10] direction in a (110) plane.

2. A curvature distribution crystal lens obtained by plastic deformation of a Si (110) single crystal plate, the plastic deformation being carried out by high-temperature press-molding, the curvature distribution crystal lens having the crystal lattice plane forming a 1D cylindrically curved surface or a 1D logarithmically curved surface whose valley is a direction perpendicular to a direction having a maximum curvature, the direction having the maximum curvature being within 30 ° from a [001] or [1-10] direction in a (110) plane.

3. The curvature distribution crystal lens according to claim 1, wherein an inclination of the crystal lattice plane with respect to the crystal surface meets Johansson's diffraction condition.

4. An X-ray reflectometer, comprising:
an X-ray generating source;
the curvature distribution crystal lens according to claim 1; and
a position-sensitive detector.

5. The curvature distribution crystal lens according to claim 2, wherein an inclination of the crystal lattice plane with respect to the crystal surface meets Johansson's diffraction condition.

6. The X-ray reflectometer according to claim 4, wherein an inclination of the crystal lattice plane with respect to the crystal surface meets Johansson's diffraction condition.

7. An X-ray reflectometer, comprising:
to an X-ray generating source;
the curvature distribution crystal lens according to claim 2; and
a position-sensitive detector.

8. The X-ray reflectometer according to claim 7, wherein an inclination of the crystal lattice plane with respect to the crystal surface meets Johansson's diffraction condition.

9. The curvature distribution crystal lens according to claim 1, wherein the crystal lattice plane has a curvature radius of 50 mm or more, and has a curvature error of 0.1 ° or less in an anticipated angle range of 30 °.

10. The curvature distribution crystal lens according to claim 2, wherein the crystal lattice plane has a curvature radius of 50 mm or more, and has a curvature error of 0.1 ° or less in an anticipated angle range of 30 °.

11. The X-ray reflectometer according to claim 4, wherein the curvature distribution crystal lens has a crystal lattice plane having a curvature radius of 50 mm or more and a curvature error of 0.1 ° or less in an anticipated angle range of 30 °.

12. The X-ray reflectometer according to claim 7, wherein the curvature distribution crystal lens has a crystal lattice plane having a curvature radius of 50 mm or more and a curvature error of 0.1 ° or less in an anticipated angle range of 30 °.

* * * * *